United States Patent [19]

Chang et al.

[11] 3,998,661
[45] Dec. 21, 1976

[54] UNIFORM MIGRATION OF AN ANNULAR SHAPED MOLTEN ZONE THROUGH A SOLID BODY

[75] Inventors: Mike F. Chang, Liverpool; Thomas R. Anthony; Harvey E. Cline, both of Schenectady, all of N.Y.

[73] Assignee: General Electric Company, Schenectady, N.Y.

[22] Filed: Dec. 31, 1975

[21] Appl. No.: 645,671

[52] U.S. Cl. .................... 148/1.5; 148/171; 148/172; 148/177; 148/179; 148/186; 148/187; 148/188; 252/62.3 GA; 252/62.3 E

[51] Int. Cl.² ...................................... H01L 21/228

[58] Field of Search .......... 148/1.5, 171, 172, 177, 148/179, 186, 187, 188; 252/62.3 E, 62.3 GA

[56] References Cited

UNITED STATES PATENTS

| | | | |
|---|---|---|---|
| 2,813,048 | 11/1957 | Pfann | 148/1 |
| 3,897,277 | 7/1975 | Blumenfeld | 148/1.5 |
| 3,898,106 | 8/1975 | Cline et al. | 148/1.5 |
| 3,899,361 | 8/1975 | Cline et al. | 148/1.5 |
| 3,899,362 | 8/1975 | Cline et al. | 148/1.5 |
| 3,901,736 | 8/1975 | Anthony et al. | 148/1.5 |
| 3,902,925 | 9/1975 | Anthony et al. | 148/1.5 |
| 3,904,442 | 9/1975 | Anthony et al. | 148/1.5 |
| 3,910,801 | 10/1975 | Cline et al. | 148/1.5 |
| 3,936,319 | 2/1976 | Anthony et al. | 148/187 X |
| 3,956,023 | 5/1976 | Cline et al. | 148/1.5 |

*Primary Examiner*—G. Ozaki
*Attorney, Agent, or Firm*—Donald M. Winegar; Joseph T. Cohen; Jerome C. Squillaro

[57] ABSTRACT

Annular regions of a predetermined type conductivity are produced in a body of semiconductor material by a temperature gradient zone melting process embodying both noncentro-symmetric rotation of the body as well as secondary rotation of the body about its vertical axis.

14 Claims, 9 Drawing Figures

UNIFORM MIGRATION OF AN ANNULAR SHAPED MOLTEN ZONE THROUGH A SOLID BODY

BACKGROUND OF THE INVENTION

1. Field of the Invention

This invention relates to processing a body of semiconductor material by a temperature gradient zone melting process to produce annular regions of a predetermined type conductivity.

2. Description of the Prior Art

Some prior art power semiconductor devices embody annular regions for various electrical functions. Additionally, many devices have a circular, or disc-like, pellet configuration. Heretofore, these circular regions have been obtained by single or double diffusion processing. Registry problems, processing temperatures, processing time, the number of processing steps, and the like, have lead to research to discover means for reducing the process times, for improving the registry problems and for increasing the yield of devices while maintaining the device reliability.

W. G. Pfann describes in "Zone Melting", John Wiley and Sons, Inc., New York (1966), a thermal gradient zone melting process to produce various desirable material configurations in a body of semiconductor material. The process had previously been disclosed in his issued U.S. Pat. No. 2,813,048, based on his application filed June 24, 1954. In both instances, cavities are generally formed in the surface of the body and a piece of wire of the metal to be migrated is disposed in the cavity. Alternately, one may deposit a layer of metal on the surface. However, the resulting structures were not desirable for commercial semiconductor usage.

M. Blumenfeld, in U.S. Pat. No. 3,897,277, teaches alloying aluminum to the surface of a body of silicon semiconductor material in an attempt to maintain the registry of the pattern of metal deposits to be migrated. However, problems of precise registry of the metal still plague one's attempt to obtain the precision necessary to obtain an array of deep diodes suitable for making x-ray imaging devices.

Recently, T. R. Anthony and H. E. Cline, discovered that employing selected etching of the surface and preferred crystallographic orientation enabled one to employ thermal gradient zone melting processing to assist in making semiconductor devices commercially. The improved process resulted in a large savings in energy required to process semiconductor materials and increased yields. For a further teaching of the improved process one is directed to their teachings in their recently granted U.S. Pat. No. 3,904,442, and copending patent application Ser. No. 519,913 filed Dec. 31, 1975.

However, when one tried to migrate annular wires of metal through semiconductor material, a true annular of circular region did not result from the process. The regions produced was continuous throughtout. However, close examination of the region revealed it to be a configuration of short straight regions integral with the mutually adjacent straight regions. The appearance and the function of the same was as if a true annular or circular ring-like structure was present.

An investigation of the process disclosed two basic reasons for failure to achieve the optimum design desired. The center of the wafer or body being processed receives a greater proportion of the source of energy and consequently, its temperature is greater than that of the periphery of the wafer or body. Therefore, a lateral or radial temperature gradient is present and distorts the molten zone moving through the solid body. A second effect observed is that a temperature falloff is occuring as a result of change in the incident angle of light emitted from the source of radiant energy used in the process. As a result of this problem, the center of the wafer or body again is receiving greater thermal energy than the outer periphery. Therefore, the thermal gradient between the center and outer periphery of the body or wafer is being further enhanced by this condition.

It is therefore an object of this invention to provide a new and improved thermal gradient zone melting process which overcomes the deficiencies of the prior art.

Another object of this invention is to provide a new and improved temperature gradient zone melting process wherein lateral and/or radial temperature gradients in a body or wafer of semiconductor material being processed thereby are minimized.

A further object of this invention is to provide a new and improved method for making annular ring-like structures in a wafer or body of semiconductor material.

Other objects of this invention will, in part, be obvious and will, in part, appear hereafter.

BRIEF DESCRIPTION OF THE INVENTION

In accordance with the teachings of this invention, there is provided an improved method for migrating a molten zone through a solid body of semiconductor material. The method includes the process steps of selecting a body of single crystal semiconductor material having two major opposed surfaces which are, respectively, the top and bottom surfaces thereof. The body also has a predetermined level of resistivity, a predetermined type conductivity, a preferred diamond cubic crystal structure, a preferred planar crystal orientation of (111) for at least the top surface. In addition, the body has a vertical axis which is substantially perpendicular to at least the top surface and substantially parallel with a first preferred crystal axis of < 111 >.

A layer of metal of a predetermined thickness in the form of a metal wire having a predetermined annular configuration is deposited on the surface of the (111). The body is placed on a supporting surface at a predetermined distance from a vertical axis thereof. The body is then simultaneously rotated in a non-centro symmetric manner about the vertical axis of the supporting surface and about the vertical axis of the body. The body of semiconductor material and the deposited layer of metal is then heated to a predetermined elevated temperature sufficient to form a melt of metal-rich semiconductor material on the surface of the body while continuing the simultaneous dual rotation cycle of the body. A temperature gradient is then established substantially parallel with the vertical axis of the body and the < 111 > crystal axis while continuing the simultaneos dual rotation cycle of the body. The surface on which the melt is formed is maintained at the lower temperature. Thereafter, each melt of metal-rich semiconductor material is migrated through the solid body of semiconductor material as a molten zone. The migration is continued for a sufficient period of time to reach a predetermined distance into the body from the top surface while continuing the simultaneous dual rotation cycle of the body. The migration of the molten zone forms an annular region of recrystallized semiconductor material of the body having solid solubility of the deposited metal therein. The annular region which is formed in situ has a substantially uniform cross-sectional area and a substantially uniform level of resistivity throughout the entire region. The annular region encloses within its peripheral surface, and electrically isolates from a portion of the remainder of the same type conductivity material, a cylindrical region of the body consisting of a predetermined volume of the material of the body. The migration may be practiced to form an annular region extending entirely through, and terminating in the opposed major surface of, the body or to produce an annular region which extends only a predetermined distance into the body from one surface. The annular region which does not extend entirely through the body is preferably formed by the process described for making finger diodes in the copending patent application of Anthony and Cline, Ser. No. 552,262 filed on Mar. 17, 1975, and incorporated herein by reference thereto.

DESCRIPTION OF THE INVENTION

Figure 1:
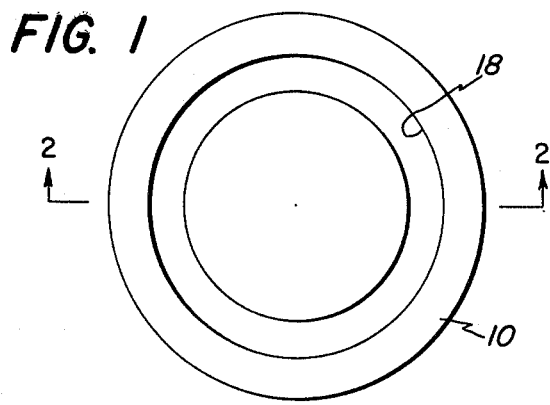
FIG. 1 is a top planar view of a semiconductor device being processed in accordance with the teachings of this invention.

With reference to FIG. 1, there is shown a body 10 of semiconductor material having a predetermined level of resistivity, a predetermined first type conductivity and a diamond cubic crystal structure. The body 10 has two opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element, and a compound of a Group III element and a Group V element.

The body 10 has a preferred planar orientation of the surface 12 of (111). This preferred planar orientation is desirable since it has previously been discovered by the two of the Applicants that any wire direction will result in stable migration through a wafer or body thickness of 6 mils, 10 mils or more depending upon the physical size of the semiconductor device being processed as well as the desired physical properties required for proper functioning of the device. Therefore, the body or wafer 10 has a preferred crystallographic orientation of its diamond cubic crystal structure wherein the <111> axis is substantially aligned with the vertical axis of the body or wafer 10. The vertical axis is substantially perpendicular to the top surface 12.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Other suitable materials for the layer or mask 16 are silicon nitride, aluminum nitride, aluminum oxide and the like. Employing well known photolithographical techniques, a photoresist, such, for example, as Kodak Metal Etch Resist, is disposed on the surface of the silicon oxide layer 16. The resist is dried by backing at a temperature of about 80° C. A suitable mask of the desired annular or circular configuration of a predetermined width is disposed on the layer of photoresist and exposed to ultraviolet light. After exposure, the layer of photoresist is washed in xylene to open windows in the mask where the one or more annular geometric configurations are designed so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows 18 corresponding to the windows of the photoresist mask are opened in the layer 16 of silicon oxide to exposure selective portions of the surface 12 of the body 10 of silicon. The processed body 10 is rinsed in deionized water and dried. The remainder of the photoresist mask is removed by immersion in concentrated sulphuric acid at 180 ° C or by immersion in a mixture of 1 part by volume hydrogen peroxide and 1 part by volume concentrated sulphuric acid.

Figure 2:
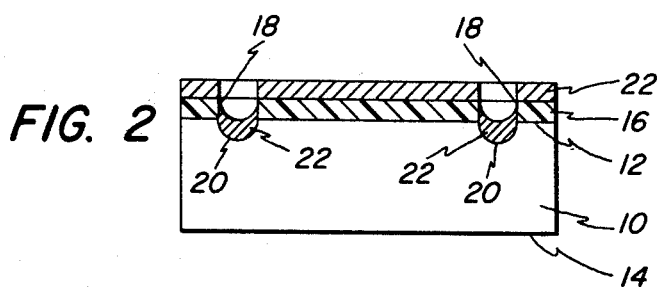
FIG. 2 is a side elevation view partly in cross-section of the device of FIG. 1 taken along the cutting plane 2—2.

Referring now to FIG. 2, a selective chemical etching of the exposed surface area of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° C to 30° C, the mixed solution selectively etches the silicon of the body 10 at a rate of approximately 5 microns per minute. An annular trough or trough-like depression 20 is etched in the surface 12 of the body 10 beneath window 18 of the oxide layer 16. The selective etching is continued until the depth of the trough 20 is approxiamately equal to the width of the window 18 in the silicon oxide layer 16. However, it has been discovered that the trough 20 should not be greater than approximately 100 microns in depth because undercutting of the silicon oxide layer 16 will occur. Undercutting of the layer 16 of silicon oxide has a detrimental effect on the width of the wire or molten zone to be migrated through the body 10. Preferably, a depth of 25 microns has been found suitable to practice the novel process. Etching for approximately 5 minutes at a temperature of 25° C will result in a trough 20 of from 25 to 30 microns in depth for a width of the window 20 of from 10 to 500 microns. The etched body 10 is rinsed in distilled water and blown dry. Preferably, a gas such, for example, as freon, argon and the like, is suitable for drying the processed body 10.

Figure 3:
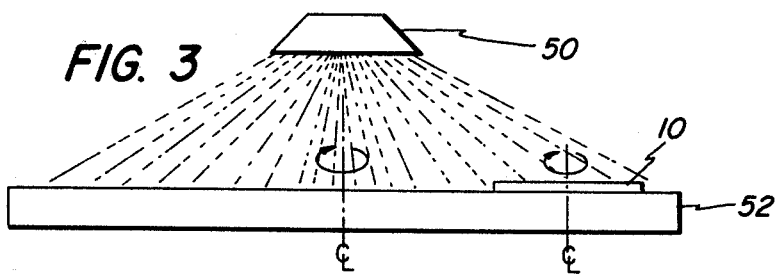
FIG. 3 illustrates a suitable means for supporting the device of FIGS. 1 and 2 for futher processing.

With reference to FIG. 3, the processed body 10 is disposed in a metal evaporation chamber. A layer 22 of a suitable metal is deposited on the remaining portions of the layer 16 of silicon oxide and on the exposed silicon in the annular trough 20. The metal in the trough 20 is the metal "wire" to be migrated or moved as a molten zone through the solid body 10. The metal of the layer 22 comprises a material, either substantially pure in itself or aligned with one or more materials to impart a predeterminted mixed or second and opposite type conductivity to the material of the body 10 through which it migrates. The thickness of the layer 22 is approximately equal to the depth of the trough 20. Therefore, if the trough 20 is 20 to 25 microns deep, the layer 20 is approximately 20 to 25 microns in thickness. A suitable material for the metal layer 22 is aluminum to obtain P-type regions in N-type silicon semiconductor material. Prior to migrating the metal wires in the trough 20 through the body of silicon 10, the excess metal of the layer 22 is removed from the silicon oxide layer 16 by such suitable means as grinding the excess metal with a 600 grit carbide paper and photolithographical technique embodying selective chemical etching of the excess metal of the layer 22.

It has been discovered that the vapor deposition of the layer 22 of aluminum metal should be performed at a pressure of approximately $1 \times 10^{-5}$ torr but not greater than $5 \times 10^{116\ 5}$. When the pressure is less than $3 \times 10^{116\ 5}$ torr, we have found that in the case of aluminum metal vapor deposited in the trough 20, the aluminum does not penetrate into the silicon and migrate through the body 10. It is believed that the layer of aluminum is saturated with oxygen and prevents reduction by the aluminum metal of the very thin silicon oxide layer between the deposited aluminum and the silicon that was formed in the air shortly after etching the troughs 18. Thus, the initial melt of aluminum and silicon required for migration is not obtained because of the inability of aluminum to wet the silicon interface. In a like manner, aluminum deposited by sputtering is not desirable as the aluminum appears to be saturated with oxygen from the process, thereby preventing the reduction of any intervening silicon oxide. The preferred methods of depositing aluminum on the silicon body 10 are by the electron beam method and the like wherein little if any oxygen can be trapped in the aluminum.

Figure 4:
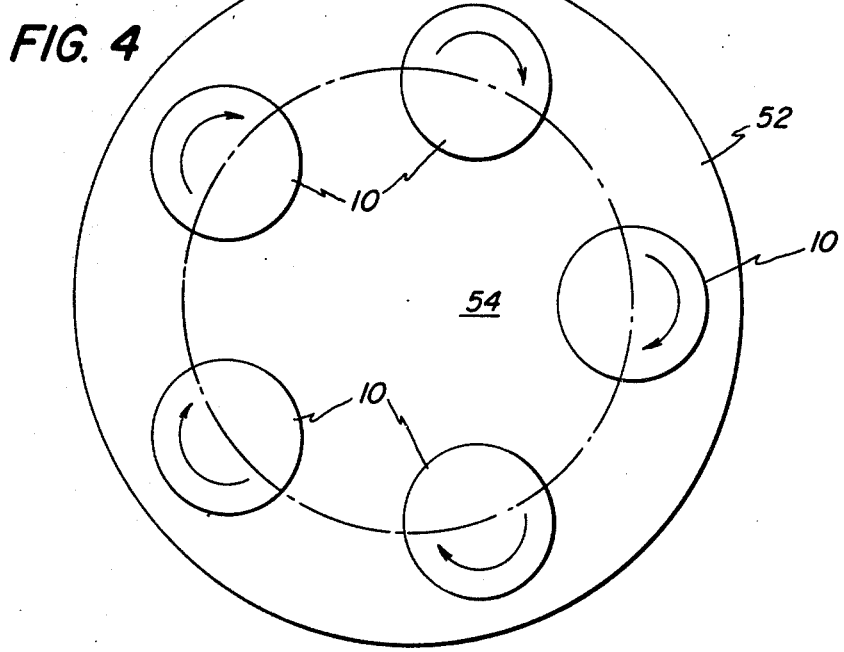
FIG. 4 is a planar view illustrating the simultaneous rotation of a plurality of the devices of FIG. 1 in accordance with the teachings of this invention.

With reference to FIGS. 3 and 4, the processed body 10 is placed in a thermal migration apparatus, and the annular metal wire 22 in the trough 20 is migrated through the body 10 as a molten zone by a thermal gradient zone melting process. The body 10 is situated in the furnace in a manner whereby a source of radiant energy 50 such, for example, as an infrared source, does not directly impinge upon the body 10. The body 10 is mounted on a table 52 in a manner whereby the bottom surface 14 is maintained at a temperature level sufficient to establish and maintain a thermal gradient necessary for migration of the wire 22 through the body 10. Preferably, the table 52 rotates about its own vertical axis, or a first center line, and the center line of the energy source is preferably aligned with this first centerline. The rotation of the table 52 may be clockwise or counter clockwise.

The body 10 is mounted on a portion of the table 52 having means suitable for rotating the body 10 about its own vertical axis or a second centerline. The body 10 may rotate either clockwise or counter clockwise. The direction of the rotation of the body 10 does not have to be the same as that of the table 52.

Figure 5:
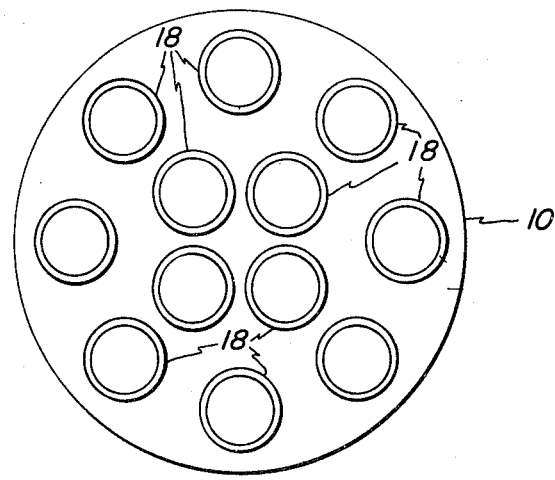
FIG. 5 is a top planar view of a device embodying a plurality of annular regions made by the process of this invention.

In commercial processing as illustrated in FIG. 4, more than one processed body 10 may undergo thermal gradient zone melting processing simultaneously. The bodies 10 are arranged on the table 10 such that preferably all the vertical axes, or each second center line of the bodies are equidistant from the vertical axis, or the first center line, of the table 52. As the table 52 rotates about its vertical axis, or the first centerline, each body 10 is rotating about its own vertical axis, or second center line, thereby establishing essentially a zero temperature gradient across the diameter of its major surface 14. For a source 50 of infrared energy at a distance of 2 centimeters from the top surface 54 of the table 52, we have found it desirable to rotate the table 52 at about 1 revolution per minute and each body 10 at about 5 revolutions per minute. More than one annular region may be formed in each body 10 as shown in FIG. 5.

A thermal gradient of approximately 50° C per centimeter between the bottom surface 14, which is the hot face and the surface 12, which is the cold face, has been discovered to be appropriate when the apparatus operating temperature is from 800° C to 1400° C. The process is practiced for a sufficient length of time to migrate or move, the metal wire as a molten zone through the solid body 10. For example, for an aluminum wire of 20 microns thickness, a thermal gradient of 50° C/cm, a 1200° C mean temperature of body 10 during processing, and at ambient, or atmospheric, pressure, a furnace time of 10 minutes is required to migrate the annular wire 22 through the silicon body 10 having a thickness of 10 mils.

The temperature gradient zone melting process and apparatus employed in the process is not a part of this invention. Additionally, for a more thorough understanding of the temperature gradient zone melting process employed in this invention and for a more thorough description of the apparatus employed for the process, one is directed to the copending applications and U.S. patents of Anthony and Cline, which are incorporated herein by reference thereto, and entitled "Method of Making Deep Diode Devices," Pat. No. 3,901,736; "High Velocity Thermal Migration Method of Making Deep Diodes", U.S. Pat. No. 3,910,801; "Deep Diode Devices and Method and Apparatus," Ser. No. 552,154 filed Feb. 24, 1975; "High Velocity Thermomigration Method of Making Deep Diodes," U.S. Pat. No. 3,898,106; "Deep Diode Device and Method," U.S. Pat. No. 3,902,925 and "Stabilized Droplet Method of Making Deep Diodes Having Uniform Electrical Properties", U.S. Pat. No. 3,899,361.

Figure 6:
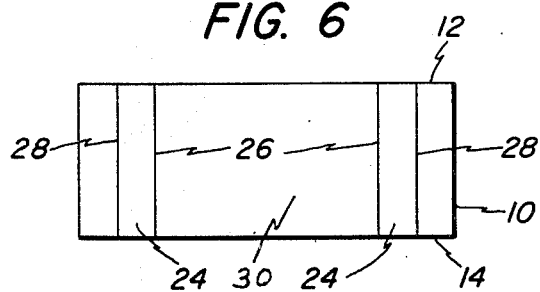
FIGS 6, 7, 8 and 9 are side elevation views of bodies of semiconductor materials processed in accordance with the teachings of this invention.

Upon completion of the temperature gradient zone melting process, the resulting processed body 10 is as shown in FIG. 6. The thermal migration of the metal wires in the troughs 18 as a molten zone through the body 10 produces a processed body 10 having region 24 of a second and opposite type conductivity than the body 10. The material of the region 24 is recrystallized semiconductor material of the body 10 suitably doped with a material comprising the metal wire and having an impurity concentration sufficient to obtain the desired conductivity. The metal retained in the recrystallized region is substantially the maximum allowed by the solid solubility of the metal in the semiconductor material through which it has been migrated. It is recrystallized material having solid solubility of the metal therein. The region 24 has a constant uniform level of impurity concentration throughout the entire planar region to impart the pedetermined type conductivity and predetermined level of resistivity thereto. The thickness of the region 24 is substantially constant throughout the entire region. In particular, the body 12 is of silicon semiconductor material of N-type conductivity and the region 24 is aluminum doped recrystallized silicon to form the required P-type conductivity region.

P-N junctions 26 and 28 are formed by the abutting contiguous surfaces of the material of opposite type conductivity. The P-N junctions 26 and 28 are well defined and show an abrupt transition from one region of conductivity. The abrupt transition produces a step P-N junction. Laterally graded P-N junctions 26 and 28 may be obtained by a post diffusion heat treatment of the annular region 24.

The annular region 24 encloses a region 30 of N-type conductivity material. The material is a part of the original material of the body 10. The region 24 electrically isolates the region 30 from the remainder of the body 10.

Alternately, the metal to be migrated may be sintered by a heat treatment process prior to forming the melt of metal-rich semiconductor material. An elevated temperature of from 500° C to 550° C for a period of time from 5 to 30 minutes will sinter the annular metal wire to the semiconductor material of the trough-like depressions. A preferred sintering temperature is 525° C ± 5° C for a period of time of about 20 minutes. The process produces incipient fusion of a portion of the metal wire to the semiconductor material of the surface with which the metal is in contact. This sintering operation aids in preventing surface tension from pulling the melt of metal-rich semiconductor material apart into two or more segments prior to initiation of the migration of the melt into the solid body.

For a more detailed description of the sintering operation, one is referred to the teachings of copending patent application, Ser. No. 645,672 filed Dec. 31, 1975, which is incoporated herein by reference.

Figure 7:
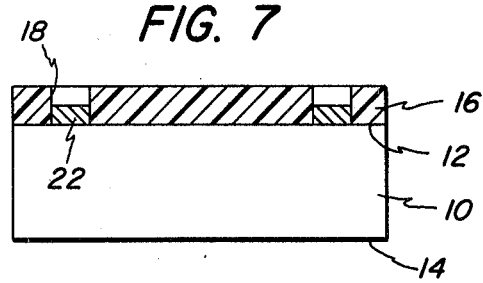

Referring now to FIG. 7, the process might alternately be practiced by utilizing the oxide layer 16 as mask to restrain the lateral flow of the metal when the melt is formed. The metal 22 may be sintered by a process described heretofore or may be migrated without sintering.

This alternate procedure often does not retain the dimensional stability of the annular metal wire when it becomes molten. Some flow of melt of the metal-rich semiconductor material may occur under the layer 16 of the interface with surface 12 in the vicinity of the window 18. However, if dimensional stability is not critical then this alternate process may be practiced.

For a more detailed teaching of the employment of the layer 16 as a means to aid in initiating the thermal gradient zone melting process, one is directed to copending patent application, Ser. No. 634,247 Nov. 21, 1975, which is incorporated herein by reference.

Figure 8:
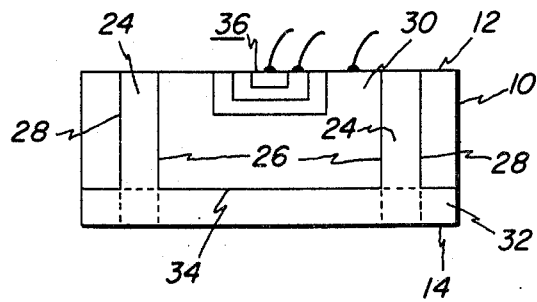

This improved process of this patent application is suitable for the fabrication of planar or mesa devices in the region 30. However, it is sometimes desirable that the region 30 be electircally isolated from the surface 14 as well. Referring now to FIG. 8, a region 32 of the same type conductivity as that of region 24 and opposite to that of region 30 is formed in the body 10. The region 32 may be formed by epitaxial growth, diffusion and the like, to form a cell comprising the electrically isolated region 30. A P-N junction 34 is formed by the abutting contiguous surfaces of the material of regions 30 and 32 of opposite type conductivity. An electrical device such, for example, as a planar semiconductor controlled rectifier 36 may be formed in the region 30 either before or after the forming of the regions 24 and 32.

Figure 9:
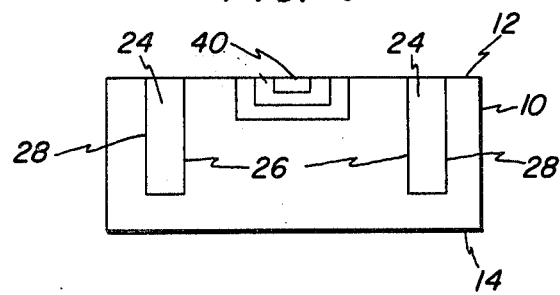

Referring now to FIG. 9, the novel process may be practiced wherein the annular regions 24 only extends to a predetermined distance from surface 12 into the body 10. A semiconductor device 40, such as a diode and the like, may be formed in the area or volume of the body 10 defined by the inner surface areas of the region 24. The device 40 may be formed before or after the formation of the annular region 24.

For a more thorough discussion of the process of migrating metal wires part way into a solid body of semiconductor material, one is directed to the copending application Ser. No. 559,262 filed Mar. 17, 1975, the teachings of which are incorporated herein by reference thereto.

We claim as our invention:

1. An improved method for migrating a molten zone through a solid body of semiconductor material comprising the process steps of:
    a. selecting a body of single crystal semiconductor material having two major opposed surfaces which are, respectively, the top and bottom surfaces thereof, a predetermined type conductivity, a predetermined level of resistivity, a preferred diamond cubic crystal structure, a preferred planar crystal orientation of (111) for at least the top surface, and a first preferred crystal axis of $<111>$ and a vertical axis which are each substantially perpendicular to at least the top surface and substantially parallel with each other;
    b. depositing a layer of metal of a predetermined thickness in the form of a metal wire having a predetermined annular configuration on the surface of (111) planar orientation;
    c. placing the body on a supporting surface at a predetermined distance from a vertical axis thereof;
    d. rotating the body simultaneously both in a non-centro symmetrical manner about the vertical axis of the supporting surface and about its own vertical axis;
    e. heating the body and the deposited metal to a predetermined elevated temperature sufficient to form a melt of metal-rich semiconductor material on the surface of the body while continuing the simultaneous dual rotation cycle of the body;
    f. establishing a temperature gradient substantially parallel with the vertical axis of the body and the preferred $<111>$ crystal axis of the crystal structure while continuing the simultaneous dual rotation cycle of the body, the surface on which the melt is formed being at the lower temperature; and
    g. migrating each melt of metal-rich semiconductor material as a molten zone through the solid body of semiconductor material for a sufficient period of time to reach a predetermined distance into the body from the top surface, while continuing the simultaneous dual rotation cycle of the body, to form in situ an annular region of recrystallized semiconductor material of the body having solid solubility of the deposited metal therein, a substantially uniform cross-sectional area and a substantially uniform level of resistivity throughout the entire region and enclosing within, and electrically isolating from a portion of the remainder of the same type conductivity material, a cylindrical region of the body consisting of a predetermined volume of the material of the body.

2. The method of claim 1 wherein the semiconductor material of the body is one selected from the group consisting of silicon, silicon carbide, germanium and gallium arsenide.

3. The method of claim 2 including the additional process step prior to depositing the metal of:
   depositing a layer of a material which is one selected from the silicon oxide, silicon nitride, aluminum oxide and aluminum nitride on the surface of (111) planar orientation, and
   etching selectively the layer of material to open at least one window therein to expose a predetermined surface area of the body therein defining the annular configuration for the metal to be deposited therein.

4. The method of claim 3 wherein
   the semiconductor material is silicon of N-type conductivity, and
   the metal is aluminum.

5. The method of claim 3 wherein
   the layer of metal is heated to a predetermined elevated temperature to sinter a portion of the metal with the semiconductor material in contact therewith.

6. The method of claim 1 including the additional process step prior to depositing the metal layer of:
   etching selectively the surface of (111) planar orientation to form at least one trough-like depression therein having an annular configuration.

7. The method of claim 6 wherein
   the semiconductor material of the body is one selected from the group consisting of silicon, silicon carbide, germanium and gallium arsenide.

8. The method of claim 7 including the additional process step prior to depositing the metal of:
   depositing a layer of material which is one selected from the group consisting of silicon oxide, silicon nitride, aluminum oxide and aluminum nitride on the surface of (111) planar orientation, and
   etching selectively the layer of material to open at least one window therein to exposure a predetermined surface area of the body therein defining the annular configuration for the metal to be deposited therein.

9. The method of claim 8 wherein
   the semiconductor material is silicon of N-type conductivity, and
   the metal is aluminum.

10. The method of claim 9 wherein
    the layer of alumimum is substantially oxygen free.

11. The method of claim 8 wherein
    the layer of metal is heated to a predetermined elevated temperature to sinter a portion of the metal with the semiconductor material in contact therewith.

12. The method of claim 1 wherein
    the width of the metal wire is less than 500 microns.

13. The method of claim 1 including the additional process step of
    forming a planar layer of semiconductor material of a type conductivity opposite to that of the material of the body, in the body, the planar region having two opposed major surfaces substantially parallel to each other and to the major opposed surfaces of the body, a major surface of the planar layer being coextensive and contiguous with the bottom major surface of the body, and wherein
    each melt is migrated to a predetermined distance through the body from the top surface to at least intersect, and be integral with, the planar layer and to form a cell of material of the body electrically isolated from the remaining material of the body and from the bottom surface of the body.

14. The method of claim 1 including the additional process step of
    forming a planar layer of semiconductor material on the bottom surface of the body, the material of the planar layer having an opposite type conductivity than that of the material of the body, the planar layer having opposed major surfaces which are substantially parallel with each other and to the opposed major surfaces of the body, and wherein
    each melt is migrated a predetermined distance through the body from the top surface to at least intersect, and be integral with, the planar layer and to form a cell of material of the body electrically isolated from the remaining material of the body and from the bottom surface of the body.

* * * * *